United States Patent
Bierer

(10) Patent No.: US 7,808,228 B1
(45) Date of Patent: Oct. 5, 2010

(54) LONG RANGE PHASING VOLTMETER

(76) Inventor: Walter S. Bierer, 183 Elton Walker Rd., Blythewood, SC (US) 29016

( * ) Notice: Subject to any disclaimer, the term of this patent is extended or adjusted under 35 U.S.C. 154(b) by 267 days.

(21) Appl. No.: 12/176,775

(22) Filed: Jul. 21, 2008

(51) Int. Cl.
*G01R 25/00* (2006.01)

(52) U.S. Cl. ............... 324/76.77; 324/126; 324/107

(58) Field of Classification Search ......... 324/76.77, 324/103 R, 103 P, 115, 126
See application file for complete search history.

(56) References Cited

U.S. PATENT DOCUMENTS

| | | | |
|---|---|---|---|
| 6,617,840 B2 * | 9/2003 | Bierer | 324/126 |
| 6,642,700 B2 | 11/2003 | Slade et al. | |
| 6,734,658 B1 | 5/2004 | Bierer | |
| 7,109,699 B1 | 9/2006 | Bierer | |

OTHER PUBLICATIONS

Webpage Innovative Technologies for the Energy Industry (article entitled the AP-20 System: Fast, Simple Phase Identification from http://www.edmlink.com/AP20_Avistar.html dated Sep. 24, 2008.

* cited by examiner

*Primary Examiner*—Vincent Q Nguyen
(74) *Attorney, Agent, or Firm*—Michael A. Mann; Nexsen Pruet, LLC

(57) ABSTRACT

A long range wireless phasing voltmeter determines the phase difference between the time-varying voltage carried on a reference electrical conductor and another, field conductor. The voltage signal from the reference conductor is measured by a reference probe and compared by a first unit in communication with that reference probe to a 60 Hz signal generated from a GPS receiver. The phase difference, in the form of a nine-bit, audible signal using frequency shift keying to modulate the carrier frequency, is transmitted to a second unit perhaps miles away. A receiver in the second unit decodes the signal and uses another 60 Hz signal generated from another GPS receiver to re-create and then forward a surrogate of the original reference voltage signal to a meter probe that is measuring the signal on a field conductor. The meter probe can then compare the two signals to determine the phase angle difference.

8 Claims, 3 Drawing Sheets

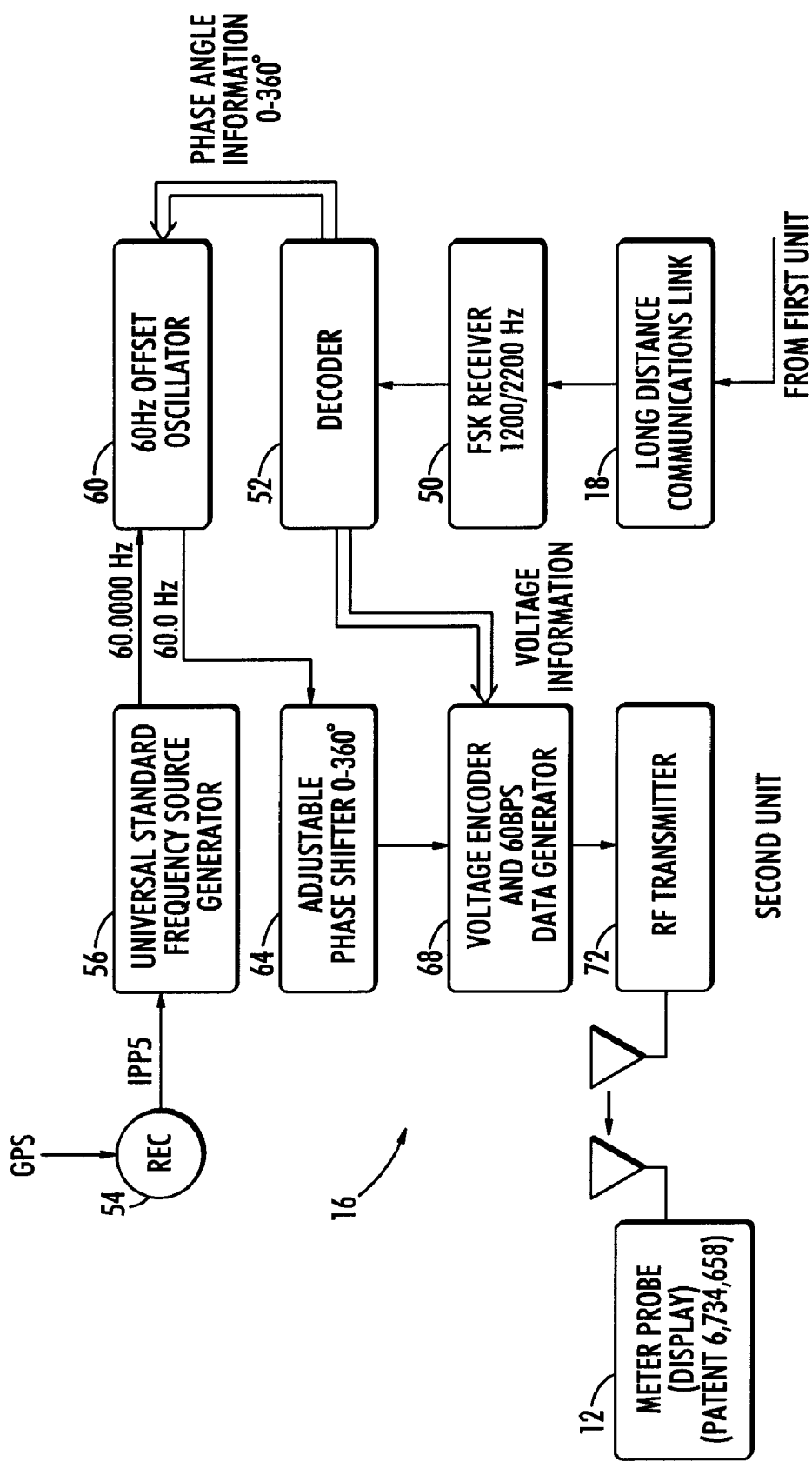

LONG RANGE PHASING VOLTMETER

BACKGROUND OF THE INVENTION

The present invention relates to high-voltage voltmeters in general and to long-range wireless phasing voltmeters in particular.

Three-phase high-voltage distribution and transmission lines consist of three energized conductors and a fourth, neutral or "ground" conductor. The three energized conductors each carry an electrical voltage that varies in magnitude at the same frequency but the phase of the voltage carried by each conductor is displaced by a phase angle of 120 degrees. The conductors carrying these three different-phased voltages are generally labeled as the A, B, C or 1, 2, 3 conductors, or equivalent depending on the utility, to tell them apart. In the simplest arrangement, the first phase, or reference phase, is arbitrarily designated to be 0 degrees, making the next phase 120 degrees displaced from the first and the last phase 240 degrees displaced from the first.

When two sets of high voltage distribution and transmission lines are to be connected, it is always, important to match the phases of each line. In total, there are six possible ways to attach any two sets of three conductors. Each of these six different connections will result in a different outcome for the device being powered, an outcome that may sometimes be significant. Incorrectly-wired three-phase transformer banks, consisting of three individual transformers, for example, can produce phase angles between 0 and 360 degrees in 30 degree steps. Accordingly, phase identification is an important measurement for those who maintain high voltage distribution and transmission systems.

Unfortunately, individual phase identification may get lost in overhead distribution and transmission systems. In underground electrical systems, which may extend for many miles, the phase identification ascribed to individual conductors is not always correct. Unauthorized digging or trenching up of an underground electrical system, which is a common occurrence, may result in loss of phase identification. Also, natural disasters such as accidents, hurricanes, tornadoes, forest fires, high winds, snow, ice, earthquakes, floods, etc. may result in loss of phase identification in above-ground and even in underground transmission systems. Mapping, phase tagging and verification of system records, for both above-ground and underground electrical systems, requires accurate phase identification.

Determining the time varying voltages of two conductors is part of the measurement but when the conductors are far enough apart, the fact that they are separated introduced errors into the comparison of the two measurements. Eliminating, correcting or avoiding those errors is vital to determining the phase difference.

Measuring the phase difference between the voltages on electrical conductors is known. One system is disclosed in U.S. Pat. No. 6,642,700 issue to Slade et al and assigned to Avistar Inc. This system identifies phase angles of electrical conductors at remote locations by measuring the time delay between an external clock source and a zero crossing of the wave form. A time tag is associated with that time delay and transmitted over a full-duplex communications link between a field unit and a reference unit. At the reference unit, the phase angle is calculated and displayed. The Avistar system uses global positioning system (GPS) as its external clock for determining the time delay.

Another phase angle measurement system is described in U.S. Pat. Nos. 6,734,658 and 7,109,699, issued to the present inventor. In this prior art system, a signal, corrected for capacitive charging currents, is obtained by a master probe measuring the voltage on a conductor in the field. The signal from the master probe is compared to another signal transmitted wirelessly and in full duplex from supplemental probe that has measured a reference voltage. The phase difference is displayed by the master probe. This system compensates for the phase shift introduced when a signal is sent from one probe to the other. The voltage signal being transmitted is encoded onto a carrier wave by modulating that wave with the voltage information itself.

These two prior art systems thus use two different ways of obtaining signals that represent the voltages of the reference and field conductors for comparison. The Avistar system compares time tags of the field signal and the reference signal, where the time tag of each is the difference between a GPS time and the zero crossing time of the alternating voltage, to determine the phase difference between the two varying voltages.

The Bierer system compares the reference conductor voltage and the field conductor voltage directly but compensates for the phase shift of the transmitted reference voltage caused by distance to the master probe measuring the field conductor voltage.

There remains a need for high voltage phasing voltmeter that is accurate, easy to read and can be used when the high voltage distribution or transmission lines are separated by many miles.

SUMMARY OF THE INVENTION

According to its major aspects and briefly recited, the present invention is a long-range, wireless, phasing voltmeter system that determines the instantaneous phase angle difference between two electrical conductors. To make that determination, a signal containing voltage and phase information is sent, possibly over a distance of many miles, from a reference voltage source proximate to an electrical conductor serving as a reference conductor to a meter probe proximate to an electrical conductor in the field. Between the reference source and the meter probe are a first unit and a second unit. The first unit may be very close to the reference probe; the second unit may be very close to the meter probe. The first unit sends a signal containing the voltage and phase information it has received from the reference probe to the second unit which forwards the voltage and phase information to the meter probe. The signal that is transmitted from the first unit to the second unit is the instantaneous voltage of that reference conductor and the phase difference between the frequency of the voltage that reference conductor carries and a known frequency serving as a standard frequency. This phase difference, when received by the second unit, is used in conjunction with the same known, standard frequency to produce a surrogate for the original instantaneous voltage carried by the reference conductor. It is the surrogate signal that is then sent to the meter probe for comparison to the voltage information on the field conductor. The result of this method is an accurate determination of the phase difference between the two conductors, regardless of the distance separating them.

The preferred choice for the known frequency is derived from the global positioning satellite clock frequency, not for its value as a source of the time or for measuring a time interval between two points in time, but for the convenience and steady frequency of the pulses it provides everywhere. The standard frequency is generated from the GPS 1 pps frequency and thus becomes a new standard, which has a 60 Hz frequency for use in the present application with 60 Hz electrical transmission frequencies.

An important feature of the present invention is the transmission of the instantaneous phase difference. The phase difference is a number between 0 and 360 and thus requires only nine bits of data be transmitted. A greater or smaller number of bits may be transmitted depending on the desired resolution. This feature allows the transfer of 100% of the phase information via a one-way, simplex communication link as opposed to the full-duplex communications system taught by the prior art. Yet, with the use of just the phase difference, a surrogate voltage signal for that carried by the reference conductor can be completely recreated for comparison to the voltage signal of the field conductor.

Another important feature of the present invention is the use of GPS clock frequency to generate a phase difference with a voltage signal. The GPS 1PPS clock frequency is used in the present invention to create a new precision frequency that is essentially the same frequency as the voltage frequency so that their phase difference is always between 0 and 360 degrees. Just as important, the GPS clock frequency received is in phase with itself regardless of the number of miles separating the receivers for the field and reference conductors; that is, a GPS pulse rising at one location rises at the same time at all locations. Accordingly, no distance-dependent adjustment is required to correct for the time it takes to transmit the signal from the reference probe to the meter probe.

These and other features and their advantages will be apparent to those skilled in the art of electric utility high voltage measurements from a careful reading of the Detailed Description of the Preferred Embodiments accompanied by the following drawings.

BRIEF DESCRIPTION OF THE DRAWINGS

In the figures,

FIG. 3 is a schematic description of the second unit according to a preferred embodiment of the present invention.

DETAILED DESCRIPTION OF THE INVENTION

The present invention is a long range phasing voltmeter system that is an improvement over existing long range phasing voltmeter systems. The improvements lie in the system's ability to accurately determine multiple parameters of an electrical system, such as phase, phase angle, phase sequence, phase rotation, voltage and voltage difference, when the electrical conductors are separated by a distance that may be many miles.

The present invention is preferably applied to the phasing voltmeter system disclosed and described in U.S. Pat. No. 6,734,658 that includes a master probe and a supplemental probe. The supplemental probe measures the time-varying voltage signal on the reference conductor; the master probe measures the time-varying voltage on the field conductor. The term supplemental probe in U.S. Pat. No. 6,734,658 is replaced herein with the term reference probe, which probe measures the voltage on an arbitrarily-designated reference conductor. The term master probe in U.S. Pat. No. 6,734,658 is replaced with the term meter probe, which probe measures the voltage on a field conductor. Alternatively, in the present invention, the reference probe may be replaced with a hard-wired configuration based on the designation of a single voltage signal as the system-wide reference source. Under these circumstances no "reference probe" in the sense of a measuring device is needed; rather, merely a "reference source" of digital voltage signal information that is equivalent to the information transmitted by the supplemental probe in U.S. Pat. No. 6,734,658. For convenience, when "reference source" is used herein it is intended to include a reference probe or a hard-wired, permanent source of a reference voltage signal.

Typically, the utility worker may wish to know if the field conductor can be connected to the reference conductor or, alternatively, what the phases of several field conductors are so they can be safely connected to each other. It is also possible that the utility worker may wish to know the phase of any conductor with respect to the utility's reference source.

Figure 1:
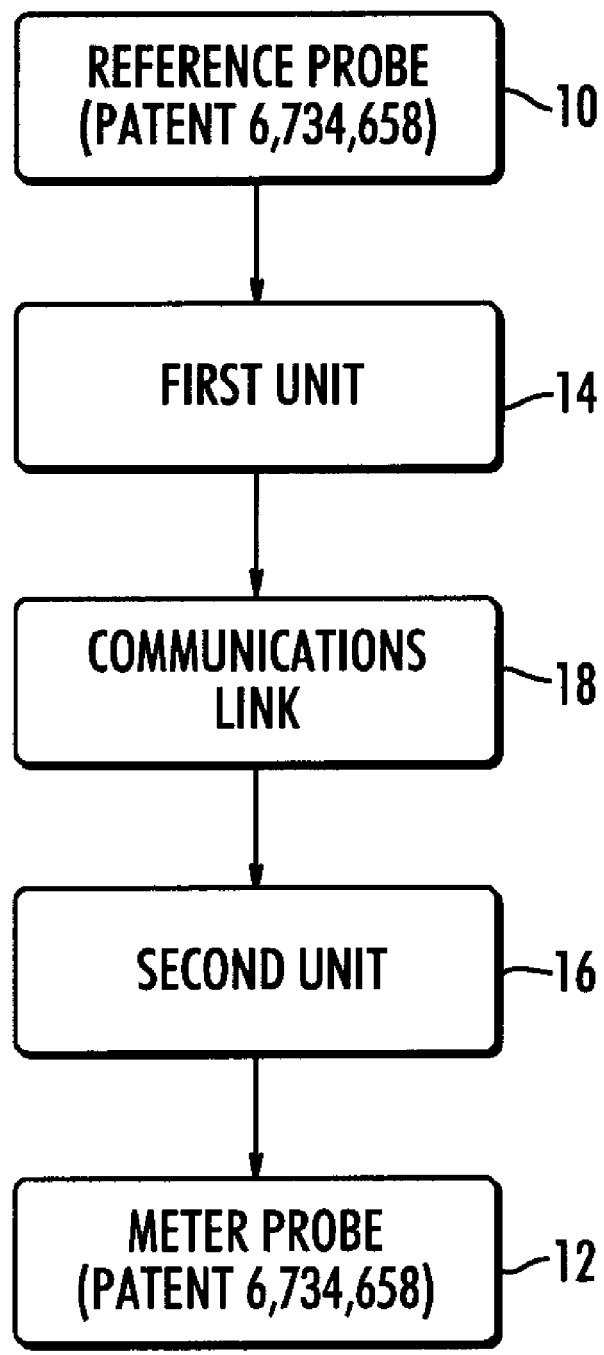
FIG. 1 is a simplex radio communications system for use with the phasing voltmeter disclosed in U.S. Pat. No. 6,734,658 showing the interposition of the first and second units between the phasing voltmeter probes, according to a preferred embodiment of the present invention.
Figure 2:
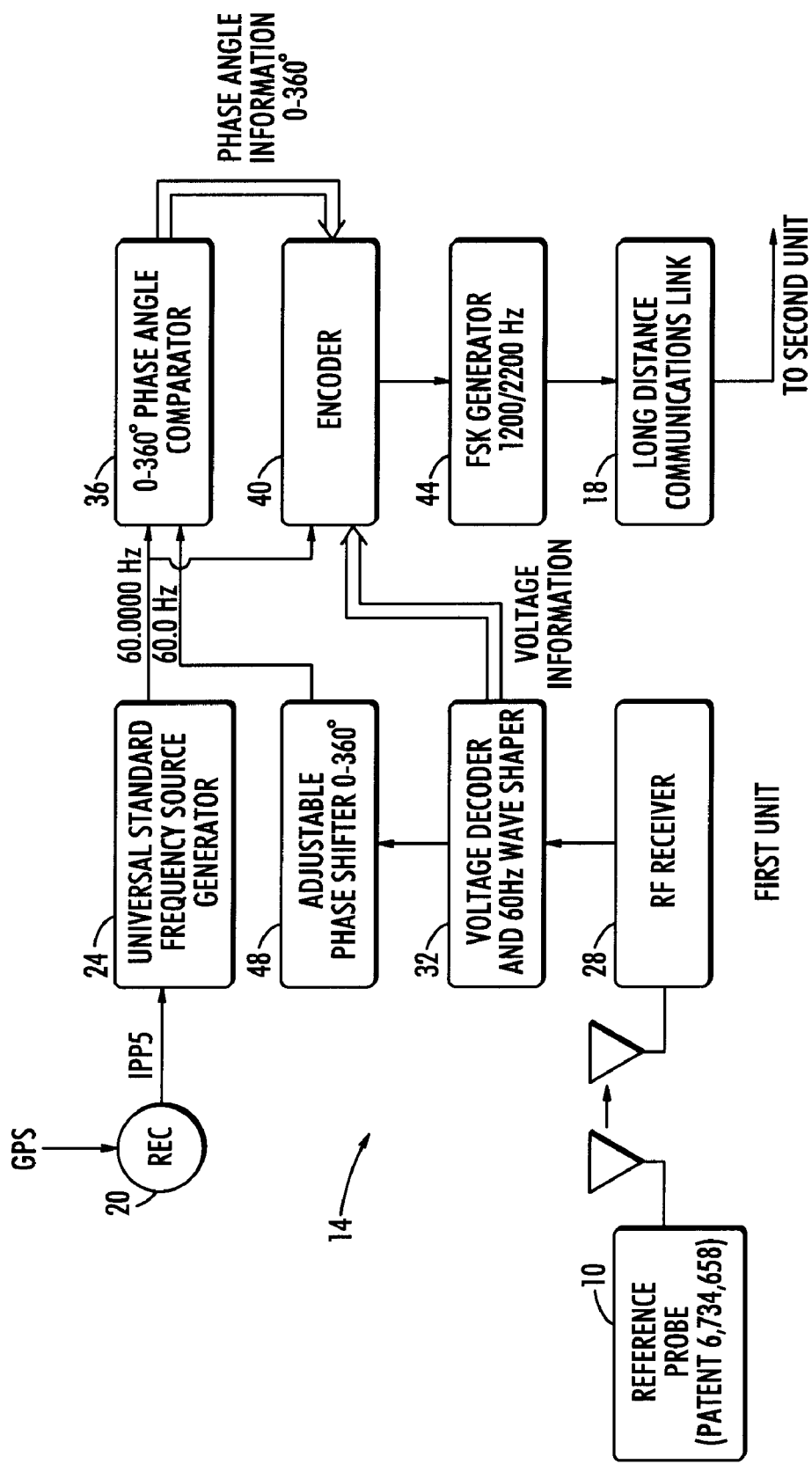
FIG. 2 is a schematic description of the first unit, according to a preferred embodiment of the present invention.

Referring now to FIGS. 1, 2, and 3, FIG. 1 shows a schematic view of the present improved phasing voltmeter, according to a preferred embodiment of the present invention. The invention includes a reference probe 10 for measuring voltage of the electrical conductor designated as the reference conductor, a meter probe 12 for measuring voltage about the electrical conductor designated as the field conductor, and between them a first unit 14 and a second unit 16 in communication via a telecommunications link 18. Reference probe 10 and meter probe 12 are as shown and described in U.S. Pat. No. 6,734,658 (allowing for changes in terminology previously described). First and second units 14, 16, may be separated by a distance, perhaps a distance of many miles. Indeed, that is the point: voltages from the reference and field conductors may be compared and their phase difference determined notwithstanding the fact that they are miles apart. The two may communicate through any type or class of telecommunications link, including one using a wireless signal, preferably a radio frequency signal, that permits the signal to be transmitted accurately over long distances despite objects and topographic features that exist between probes 10, 12.

First and second units 14, 16, cooperate with each other and with reference and meter probes 10, 12, to allow the information from the reference probe 10 to be put into a simplified form so that it can be transmitted by simplex rather than duplex transmission equipment. In particular, as seen in FIG. 2, first unit 14 obtains a frequency signal from a known standard frequency source, preferably the global positioning satellite (GPS) system and a voltage signal from reference probe 10. This GPS source generates a steady and accurate pulse each second that can be received nearly everywhere. That frequency of 1 pulse per second (1 PPS) received by a GPS receiver 20 is used to generate a precision 60 Hz signal in the 60 Hz universal standard frequency source generator 24 in order to very nearly match the frequency of the 60 Hertz of the AC voltage carried by the reference conductor. This precision 60 Hz signal is fed into a phase angle comparator 36.

GPS receiver 20 is an inexpensive off-the-shelf item that is capable of providing a stream of pulses at the rate of 1 pps synchronized to the standard second +/−1 micro-second and referenced to Universal Standard Time. Any number of these 1 pps GPS receivers will produce output pulses that will all rise in unison, regardless of where they are placed on earth. The 60 Hz (and 50 Hz) Universal Standard Frequency Source ("USFS") is a term used to describe generator 24. It is a microprocessor with its own precision internal clock used to generate a local precision frequency source of 60.00000 Hz (or 50.00000 Hz in locations where the electrical transmission frequency is 50 Hz). The number of zeros represents its precision. The 60 Hz USFS generator 24, as described in the present invention, becomes a new standard since it is based on the 1 pps output of the GPS receiver, and is and not merely synchronized with the GPS signal. Each cycle of the 60 Hz USFS generator 24 output will have the same frequency and phase regardless of where it is anywhere on earth when it is receiving the 1 PPS signal from a GPS receiver 20.

The output of the 60 Hz USFS generator 24 is a wave form that may be sinusoidal or have some other shape, but preferably a shape that has a fairly steep rising edge such as a square pulse or sawtooth pulse.

Meanwhile, the 60 bit per second ("bps") voltage and phase angle data from reference probe 10 is being received by receiver 28 and fed into a voltage decoder and wave shaper 32 in first unit 14. The 60 bps data stream generated by reference probe 10 as described in U.S. Pat. No. 6,734,658 (and referred to therein as a supplemental probe), incorporated herein in its entirety by reference, is representative of the voltage and phase angle present on the reference source that is attached to the electric utility power grid. Voltage decoder 32 decodes the 60 bps voltage signal and forwards it to the encoder 40 for transmission. The wave shaper takes the incoming 60 bps synchronous data stream and reshapes into a 60 Hz continuous signal that is of the exact phase of the reference voltage on the reference conductor. This continuous 60 Hz wave form will be compared to the 60 Hz USFS signal from generator 24 by phase angle comparator 36 to determine the phase difference between the two. That phase difference and other voltage information from the output of voltage decoder and wave shaper 32 is combined by encoder 40 and used to modulate an audible signal by a frequency shift keying generator 44 using frequency shift keying preferably at 1200 and 2200 Hz for the pulses.

Note that the time signal from the GPS system is not needed, either to mark the time or to mark a difference between two points in time. Rather, phase angle comparator 36 continuously measures the actual phase angle between the 60 Hz USFS and 60 Hz reference frequency derived from the power grid. This measured phase angle must lie between 0 and 360 degrees. It is that phase difference that characterizes the phase of the transmission from reference probe 10 to first unit 14 and hence the voltage wave riding the reference conductor. A nine-bit digital word can represent a decimal number from 0 to 511 with 1 degree of resolution ($2^9-1=511$). A mere nine bits of data will contain all of the information necessary to eventually obtain all of the desired measurements relating to phase, phase angle, phase sequence, and phase rotation. A greater or smaller number of bits may be used depending on the desired resolution. The phase difference obtained by phase angle comparator 36 is expressed in parallel digital data form.

Encoder 40 takes the nine bits of parallel phase angle data and converts them into a serial data stream using audio frequencies FSK, DTMF or Audio Frequency Spread Spectrum so that the data may be applied via audio coupling into any means of transmitting audio over long distances using any type or class of telecommunications link including telephone lines. Encoder 40 may also be used to represent phase to ground voltages from 1 to 511 kV in 1 kV steps, into a nine-bit, serial data stream and transmitted as stated above. A greater or smaller number of bits may be used depending on desired resolution.

First unit 14 may include an adjustable phase shifter 48 that allows the user to arbitrarily set the signal of the reference source to any angle between 0° and 360°. If the reference conductor is known to be the "B" conductor, adjustable phase shifter 48 can be set to 120 degrees so that any field conductor in phase with the reference conductor will be a "B" conductor and any conductor 240 degrees out of phase with the B conductor is an A conductor. Phase angle adjuster 48 thereby allows the electric utility to select which phase in its system it wants to establish as the leading or A phase.

A frequency shift keying receiver 50 in second unit 16, as seen in FIG. 3, receives the transmission from first unit 14 from communications link 18, still in audio form, and demodulates the audio carrier wave, and then uses a decoder 52 to decode the phase angle data from serial form to parallel form. Meanwhile, second unit 16, in the same manner as first unit 14, receives the 1 PPS GPS frequency signal from a GPS receiver 54 and uses another 60 Hz USFS generator 56 to generate a precision 60 Hz signal identical in both frequency and phase to that generated by generator 24 of first unit 16. The decoded phase difference (in parallel data form) and this 60 Hz USFS signal are both fed into a 60 Hz offset oscillator 60. Offset oscillator 60, using the nine bits of phase angle data from first unit 14 and the locally-generated, USFS 60 Hz signal, creates a new 60 Hz frequency wave form. The new wave form has exactly the same frequency and phase angle offset with respect to the USFS frequency as the original 60 Hz frequency received by first unit 14 from reference probe 10 and that was representative of the voltage on the reference electrical conductor attached to the power grid.

This new wave form acts as a surrogate for the reference conductor-carried wave form. The phase difference between the original voltage wave form and the USFS was transmitted from first unit 14 to second unit 16, where the received phase difference was used, together with exactly the same USFS (but possibly a different cycle or many cycles later, depending on the time delay through the telecommunications link), to re-create the original 60 Hz wave form by generating the surrogate wave form.

Second unit 16 may also have a user-adjustable phase shifter 64 in the event the user wishes to adjust the phase of this 60 Hz wave form as received. The surrogate signal wave form is shifted if desired by the user using adjustable phase shifter 64 and then encoded as a 60-bps data stream by a data generator 68 prior to transmission by a radio frequency transmitter 72 to meter probe 12. Data generator 68 synchronizes a 60 bps data stream, carrying the voltage information, to the newly created 60 Hz surrogate wave form frequency. Meter probe 12 can thus display multiple parameters of an electrical system such as, phase, phase angle, phase sequence, phase rotation, voltage and voltage difference.

A display, as disclosed in U.S. Pat. No. 6,734,658, for a master probe, will display the voltage and phase angle differences between the reference conductor and the field conductor as well as the other parameters mentioned above.

Those skilled in the art of high-voltage measurement and transmission and grid management will appreciate that modifications and substitutions may be made to the preferred embodiments described herein without departing from the spirit and scope of the present invention, which is defined by the appended claims.

What is claimed is:

1. A phasing voltmeter, comprising:
   (a) a reference source transmitting a reference voltage signal;
   (b) a field probe measuring a field voltage signal representative of that carried by a field conductor;
   (c) a first unit in communication with said reference source and receiving said transmitted reference voltage signal, said first unit carrying:
   a generator that produces a standard frequency source signal, a phase angle comparator that determines the phase difference between the phase angle of said reference voltage signal and the phase angle of said standard frequency source signal, said phase difference in digital form, and a signal generator that modulates a carrier wave using said digital form of said phase difference and transmits said modulated carrier wave; and (d) a second unit in communication with said first unit and receiving said transmitted modulated carrier wave, said second unit carrying:

a generator that produces a standard frequency source signal, a receiver that extracts said phase difference from said carrier, a frequency offset oscillator that produces a surrogate voltage signal from said phase difference and said standard frequency source signal, said surrogate voltage signal replicating said reference voltage signal of said reference source, said second unit transmitting said surrogate voltage signal to said meter probe, wherein said meter probe determines the phase difference between said surrogate signal and said field voltage signal, said meter probe having a display for displaying said phase difference.

2. The phasing voltmeter as recited in claim 1, wherein said standard frequency source signal of said first unit and said second unit is 50 Hz or 60 Hz.

3. The phasing voltmeter as recited in claim 1, wherein said first unit includes a global positioning satellite receiver having an output of 1 pps, and wherein said generator of said first unit receives said output of said global positioning satellite receiver and generates said standard frequency source therefrom.

4. The phasing voltmeter as recited in claim 1, wherein said second unit includes a global positioning satellite receiver having an output of 1 pps, and wherein said generator of said second unit receives said output of said global positioning satellite receiver and generates said standard frequency source therefrom.

5. The phasing voltmeter as recited in claim 1, wherein said signal generator of said first unit transmits said modulated carrier to said second unit using frequency shift keying.

6. The phasing voltmeter as recited in claim 1, wherein said signal generator of said first unit transmits said modulated carrier to said second unit using an audible frequency.

7. The phasing voltmeter as recited in claim 1, wherein said first unit carries a phase shifter permitting a user to set the phase of the field voltage signal to any phase between 0° and 360°.

8. The phasing voltmeter as recited in claim 1, wherein said second unit carries a phase shifter permitting a user to set the phase of said surrogate voltage signal to any phase between 0° and 360°.

* * * * *